(12) United States Patent
Pajkic et al.

(10) Patent No.: US 11,967,668 B2
(45) Date of Patent: Apr. 23, 2024

(54) OPTOELECTRONIC COMPONENT WITH CONDUCTIVE, FLEXIBLE AND EXTENDABLE CONNECTING ELEMENT AND METHOD FOR PRODUCING THE SAME

(71) Applicant: OSRAM Opto Semiconductors GmbH, Regensburg (DE)

(72) Inventors: Zeljko Pajkic, Regensburg (DE); David Racz, Regensburg (DE); Luca Haiberger, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 492 days.

(21) Appl. No.: 17/283,493

(22) PCT Filed: Sep. 24, 2019

(86) PCT No.: PCT/EP2019/075696
§ 371 (c)(1),
(2) Date: Apr. 7, 2021

(87) PCT Pub. No.: WO2020/074252
PCT Pub. Date: Apr. 16, 2020

(65) Prior Publication Data
US 2021/0399180 A1    Dec. 23, 2021

(30) Foreign Application Priority Data

Oct. 8, 2018    (DE) .......................... 102018124751.6

(51) Int. Cl.
*H01L 33/50* (2010.01)
*H01L 33/00* (2010.01)
(Continued)

(52) U.S. Cl.
CPC ........ *H01L 33/502* (2013.01); *H01L 33/0093* (2020.05); *H01L 33/52* (2013.01); *H01L 33/62* (2013.01)

(58) Field of Classification Search
CPC ... H01L 33/502; H01L 33/0093; H01L 33/52; H01L 33/62
See application file for complete search history.

(56) References Cited

U.S. PATENT DOCUMENTS

| 4,581,687 A | 4/1986 | Nakanishi |
| 2003/0193803 A1* | 10/2003 | Lin .......................... F21S 4/24 362/800 |

(Continued)

FOREIGN PATENT DOCUMENTS

| CN | 101052898 A | 10/2007 |
| CN | 105324841 A | 2/2016 |

(Continued)

OTHER PUBLICATIONS

International Search Report and Written Opinion in corresponding International Application No. PCT/EP2019/075696 mailed on Dec. 5, 2019, 14 pages.

*Primary Examiner* — Lex H Malsawma
(74) *Attorney, Agent, or Firm* — MH2 TECHNOLOGY LAW GROUP LLP

(57) ABSTRACT

The invention relates to an optoelectronic component, comprising: at least two optoelectronic semiconductor chips, which are designed to emit electromagnetic radiation during operation; at least one connecting element, which is electrically conductive, flexible and extensible; and a shaped body, which surrounds the at least two optoelectronic semiconductor chips and the at least one connecting element at least in some locations, wherein the optoelectronic semiconductor chips are each arranged on a carrier. The inven- (Continued)

tion further relates to a method for producing an optoelectronic component.

18 Claims, 4 Drawing Sheets

(51) Int. Cl.
    *H01L 33/52*     (2010.01)
    *H01L 33/62*     (2010.01)

(56) References Cited

U.S. PATENT DOCUMENTS

| | | |
|---|---|---|
| 2005/0213321 A1 | 9/2005 | Lin |
| 2013/0107514 A1 | 5/2013 | McNabb et al. |
| 2013/0249394 A1 | 9/2013 | Fay |
| 2015/0338080 A1 | 11/2015 | Dexter et al. |
| 2017/0003440 A1 | 1/2017 | Kim et al. |
| 2017/0005077 A1 | 1/2017 | Kim et al. |
| 2018/0087765 A1 | 3/2018 | Horter et al. |

FOREIGN PATENT DOCUMENTS

| | | |
|---|---|---|
| CN | 107429896 A | 12/2017 |
| CN | 107710885 A | 2/2018 |
| DE | 102015102407 A1 | 9/2016 |
| EP | 1357330 A2 | 10/2003 |
| EP | 3136829 A1 | 3/2017 |
| WO | 2014124044 A1 | 8/2014 |
| WO | 2017112342 A1 | 6/2017 |

\* cited by examiner

OPTOELECTRONIC COMPONENT WITH CONDUCTIVE, FLEXIBLE AND EXTENDABLE CONNECTING ELEMENT AND METHOD FOR PRODUCING THE SAME

CROSS-REFERENCE TO RELATED APPLICATIONS

This patent application is a national stage entry from International Application No. PCT/EP2019/075696, filed on Sep. 24, 2019, published as International Publication No. WO 2020/074252 A1 on Apr. 16, 2020, and claims priority under 35 U.S.C. § 119 from German patent application 10 2018 124 751.6, filed Oct. 8, 2018, the entire contents of all of which are incorporated by reference herein.

FIELD

An optoelectronic component and a method for producing an optoelectronic component are disclosed.

BACKGROUND

One problem to be solved is to specify an extensible optoelectronic component. Another problem to be solved is to disclose a method for producing an extensible optoelectronic component.

SUMMARY

According to at least one embodiment of the optoelectronic component, the optoelectronic component comprises at least two optoelectronic semiconductor chips which are designed to emit electromagnetic radiation during operation. The optoelectronic semiconductor chips are, for example, luminescent diode chips such as light-emitting diode chips or laser diode chips. The optoelectronic semiconductor chips can be designed to emit electromagnetic radiation in the visible range during operation.

According to at least one embodiment, the optoelectronic component comprises at least one connecting element that is electrically conductive, flexible, and extensible. For example, the connecting element may be formed with or from a wire. For example, the connecting element comprises an electrically conductive material such as a metal. That the connecting element is flexible may mean that the connecting element is reversibly or irreversibly bendable or pliable in at least one direction. In particular, this means that the connecting element can be reversibly or irreversibly deformed, bent or flexed in at least one direction. Preferably, the connecting element can be deformed, bent or flexed in different directions. The connecting element can be deformed both plastically and elastically. Thus, the connecting element can be bendable or curvable. In particular, the connecting element does not comprise a rigid shape. This may mean that the connecting element can be bent without the connecting element being destroyed or broken. That the connecting element is extensible may mean that the length of the connecting element can be reversibly or irreversibly changed. In this case, the length of the connecting element can be changed within a tolerance range without the connecting element being destroyed in the process. A change in length can mean that the length of the connecting element is lengthened or shortened. Thus, the connecting element can be elastic. The optoelectronic semiconductor chips and the connecting element may be mechanically connected to each other.

According to at least one embodiment, the optoelectronic component comprises a shaped body which surrounds the at least two optoelectronic semiconductor chips and the at least one connection element at least in some locations. The shaped body may be manufactured by means of a casting and/or injection molding process. In this context, these methods include all manufacturing methods in which a molding compound is brought into a predetermined mold and, in particular, is subsequently cured. In particular, the term casting method includes casting, injection molding, transfer molding and compression molding. The shaped body may be molded to the optoelectronic semiconductor chips. The shaped body may be in direct contact with the optoelectronic semiconductor chips. In addition, the shaped body may be arranged in some locations spaced from the connecting element.

The shaped body may comprise a polymeric material, such as one or more silicones. In particular, the shaped body is flexible and extensible. Further, the shaped body may be transparent to electromagnetic radiation emitted from the optoelectronic semiconductor chips. This may mean that the shaped body is transparent or translucent to the electromagnetic radiation emitted by the optoelectronic semiconductor chips.

According to at least one embodiment of the optoelectronic component, the optoelectronic semiconductor chips are each arranged on a carrier. The carrier may be, for example, a connection carrier, a printed circuit board, a printed circuit board, or a wafer. The carrier may be a three-dimensional body and may comprise, for example, the shape of a cylinder, a disk, or a cuboid. The carrier may comprise a main extension plane. For example, the main extension plane of the carrier is parallel to a surface, such as a top surface, of the carrier. The carrier may comprise a semiconductor material. For example, the carrier may comprise silicon onto which and/or into which electrically conductive structures, such as conductor tracks and/or contact points, are applied and/or brought in.

The carrier may be flexible. This may mean that the carrier can be reversibly or irreversibly bent or flexed in at least one direction. In particular, this may mean that the carrier can be reversibly or irreversibly deformed, bent or flexed in at least one direction. Preferably, the carrier can be deformed, bent or flexed in different directions. The carrier can be deformed both plastically and elastically. Thus, the carrier can be bendable or curvable. In particular, the carrier does not comprise a rigid shape. This may mean that the carrier can be bent without the carrier being destroyed.

The shaped body may surround the carrier at least in some locations. The shaped body may be in direct contact with the carrier in some locations. In addition, the shaped body may be molded to the carrier.

The optoelectronic semiconductor chips may be attached to a respective carrier by means of an adhesive material or a solder material. The optoelectronic semiconductor chips may be surface mountable semiconductor chips. It is further possible that the optoelectronic semiconductor chips comprise at least one electrical contact on a side facing away from the carrier, wherein this electrical contact is connected to the carrier via a bonding wire.

A radiation exit side of the optoelectronic semiconductor chips can be a side facing away from the carrier. A main radiation direction of the optoelectronic semiconductor chips may be perpendicular to the main extension plane of the carrier and point away from the carrier.

According to at least one embodiment of the optoelectronic component, the optoelectronic component comprises at least two optoelectronic semiconductor chips which are designed to emit electromagnetic radiation during operation, at least one connecting element which is electrically conductive, flexible and extensible, and a shaped body which surrounds the at least two optoelectronic semiconductor chips and the at least one connecting element at least in some locations, wherein the optoelectronic semiconductor chips are each arranged on a carrier.

The optoelectronic component described herein is based inter alia on the idea that extensibility of the optoelectronic component can be enabled by using at least one flexible and extensible connecting element. The connecting element can be arranged between two optoelectronic semiconductor chips each. Since the shaped body may also be flexible and extensible, the optoelectronic component may be flexible and extensible as a whole. A flexible and extensible optoelectronic component is advantageous in many applications. For example, the optoelectronic component can be adapted to various applications. For example, an optoelectronic component of one size can be used in different applications of different sizes. For this purpose, the optoelectronic component can be flexibly bent and the length of the optoelectronic component can be adapted to the particular application. In addition, the optoelectronic component can be used in flexible applications, such as garments.

According to at least one embodiment of the optoelectronic component, at least one cavity is formed in the shaped body and the at least one connecting element is arranged in the cavity. The cavity is a recess in the shaped body. Thus, the cavity is free of the material of the shaped body. The volume of the cavity may be greater than the volume of the connecting element. The cavity may surround the connecting element from different sides, at least in some locations. Further, the cavity may be directly adjacent to the shaped body. The cavity may be filled with a gas, for example with air. Therefore, the connecting element is movable in the cavity. This allows bending or extending of the connecting element in the cavity. By bending or extending the connecting element in the cavity, the entire optoelectronic component can also be bent or extended. It is further possible that the connecting element in the cavity may be compressed, and thus the optoelectronic component may also be compressed. "Compressing" in this context may mean that the length of the connecting element is shortened.

According to at least one embodiment of the optoelectronic component, the carriers are each at least partially transparent to the electromagnetic radiation emitted by the respective associated optoelectronic semiconductor chip. This can mean that the carrier is transparent or translucent for the electromagnetic radiation emitted by the respectively associated optoelectronic semiconductor chip. Advantageously, electromagnetic radiation emitted by the optoelectronic semiconductor chip can thus also exit the optoelectronic component at the side of the carrier. Therefore, overall, electromagnetic radiation emitted from the optoelectronic semiconductor chip can exit the optoelectronic component in different directions.

According to at least one embodiment of the optoelectronic component, the connecting element is in the form of a spring or a coil. This may mean that the connecting element comprises at least two windings. The connecting element may be in the form of a wire which is wound as a spring or coil. It is further possible that the connecting element is a spring or a coil. The connecting element may comprise an electrically conductive material. That the connecting element is in the form of a spring or a coil allows the connecting element to be flexible and extensible. A spring or a coil can be bent in various directions. Furthermore, a spring or a coil can be extended or compressed in length.

According to at least one embodiment of the optoelectronic component, the connecting element is electrically connected to at least one of the carriers. The carrier may comprise an electrical contact to which the connecting element is electrically connected. The associated optoelectronic semiconductor chip can be supplied with energy via the electrical contact of the carrier. Thus, several optoelectronic semiconductor chips can be electrically connected in series via the electrical connection between the connecting element and at least one carrier.

According to at least one embodiment of the optoelectronic component, the shaped body comprises a molding compound. The molding compound may be transparent to the electromagnetic radiation emitted by the optoelectronic semiconductor chips during operation. This may mean that the molding compound is transparent or translucent to the electromagnetic radiation emitted by the optoelectronic semiconductor chips during operation. The molding compound may be molded to the optoelectronic semiconductor chips and the cavity by a molding method. Advantageously, the electromagnetic radiation emitted by the optoelectronic semiconductor chips in operation or a majority of the electromagnetic radiation emitted by the optoelectronic semiconductor chips in operation can thus exit the optoelectronic device through the shaped body.

According to at least one embodiment of the optoelectronic device, the molding composition comprises a polymer material. The polymer material may be silicone or silicones. Further, it is possible that the polymer material is a material designed to convert the wavelength of electromagnetic radiation emitted by the optoelectronic semiconductor chips. Advantageously, the polymer material is transmissive to the electromagnetic radiation emitted by the optoelectronic semiconductor chips.

According to at least one embodiment of the optoelectronic component, conversion particles and/or scattering particles are brought into the molding compound. The molding compound can thus be a matrix material. The conversion particles may be designed to convert the wavelength of the electromagnetic radiation emitted by the optoelectronic semiconductor chips during operation. Thus, the wavelength or color of the electromagnetic radiation emitted by the optoelectronic device in operation can be adjusted or changed. The scattering particles may comprise different shapes and sizes. In particular, the scattering particles may be opaque to radiation. That is, the scattering particles absorb or reflect the electromagnetic radiation emitted by the optoelectronic semiconductor chips. It is also possible that the electromagnetic radiation emitted by the optoelectronic semiconductor chips is scattered by the scattering particles. Thus, the electromagnetic radiation emitted from the optoelectronic semiconductor chips may be emitted from the optoelectronic device in different directions.

According to at least one embodiment of the optoelectronic component, an external sheating surrounds the shaped body. The sheathing may completely surround the shaped body. The sheathing may be applied as a single layer to the shaped body. For example, the sheating comprises nylon or polyester. The sheathing may serve to protect the shaped body from external environmental influences.

According to at least one embodiment of the optoelectronic component, the optoelectronic semiconductor chips are arranged such that their main radiation directions are different from each other. This may mean that one of the optoelectronic semiconductor chips comprises a main radiation direction of the emitted electromagnetic radiation which is different from the main radiation direction of another optoelectronic semiconductor chip. For this purpose, one of the optoelectronic semiconductor chips with its associated carrier can be arranged rotated by 180° with respect to another optoelectronic semiconductor chip with its associated carrier. This arrangement allows the optoelectronic device to emit electromagnetic radiation in different directions during operation.

According to at least one embodiment of the optoelectronic component, an extensible reflective layer is applied to the shaped body in some locations. The extensible reflective layer may be applied to the shaped body on a side facing an underside of the carrier, wherein the underside of the carrier faces away from the optoelectronic semiconductor chip. The extensible reflective layer may completely cover the shaped body on the side facing the carrier. That the extensible reflective layer is extensible may mean that the extensible reflective layer remains intact when the shaped body is extended, compressed, or bent. In other words, the extensible reflective layer is not damaged or broken into separate pieces when the shaped body is extended, compressed, or bent. The extensible reflective layer may be designed to reflect electromagnetic radiation emitted from the optoelectronic semiconductor chips during operation. This allows electromagnetic radiation emitted by the optoelectronic semiconductor chips in operation to not exit the shaped body on all sides. For example, the electromagnetic radiation emitted by the optoelectronic semiconductor chips during operation preferably exits the optoelectronic component in a partial area specified by means of the reflective layer.

According to at least one embodiment of the optoelectronic component, a connecting element is arranged between each two optoelectronic semiconductor chips. This can mean that the connecting element is mechanically connected to the carriers of the two optoelectronic semiconductor chips. Further, the connecting element may be electrically connected to both optoelectronic semiconductor chips. For this purpose, the connecting element may be electrically connected to the two carriers. Since one connecting element is arranged between each two optoelectronic semiconductor chips, the optoelectronic device is flexible and extensible as a whole.

According to at least one embodiment of the optoelectronic component, the optoelectronic semiconductor chips are arranged between a connecting element and a further connecting element. The further connecting element may comprise the same structure as the connecting element. The carrier of the optoelectronic semiconductor chip may be mechanically connected to the connecting element and the further connecting element. Further, the optoelectronic semiconductor chip may be electrically connected to the connecting element and the further connecting element. To this end, the carrier of the optoelectronic semiconductor chip may be electrically connected to the connecting element and the further connecting element. Since the optoelectronic semiconductor chips are arranged between a connecting element and a further connecting element, the optoelectronic component is flexible and extensible as a whole.

According to at least one embodiment of the optoelectronic component, a plurality of optoelectronic semiconductor chips and a plurality of connecting elements are arranged in series. Thereby, the optoelectronic semiconductor chips and the connecting elements may be arranged alternately. This may mean that one connecting element is arranged between each two optoelectronic semiconductor chips, and one optoelectronic semiconductor chip is arranged between each two connecting elements. The optoelectronic semiconductor chips and the connecting elements may be electrically connected in series. In total, the optoelectronic component may comprise at least ten optoelectronic semiconductor chips. Further, the optoelectronic component may comprise at most 70 optoelectronic semiconductor chips. Thus, the optoelectronic component may be a chain configured to emit electromagnetic radiation during operation. The length of the optoelectronic component may be at least 10 mm and at most 50 cm. A cross-section through the optoelectronic component may be at most 1 cm. Since the optoelectronic component is flexible and extensible, it can be adapted to various geometries.

According to at least one embodiment of the optoelectronic component, a plurality of optoelectronic semiconductor chips and a plurality of connecting elements are arranged along a ring. The ring may be a closed chain of optoelectronic semiconductor chips and connecting elements. In this regard, the optoelectronic semiconductor chips and the connecting elements may each be arranged alternately. The optoelectronic semiconductor chips and the connecting elements may be electrically connected in series. The optoelectronic component may comprise at most ten optoelectronic semiconductor chips. Since the optoelectronic component is flexible and extensible, the ring of optoelectronic semiconductor chips and connecting elements can be adapted to different geometries.

An optoelectronic device is also specified. According to at least one embodiment of the optoelectronic device, the optoelectronic device comprises an optoelectronic component described herein and a power supply to which the optoelectronic component is electrically connected. At least one of the optoelectronic semiconductor chips or at least one connecting element is electrically connected to the power supply. In particular, the energy supply is designed to supply the optoelectronic semiconductor chips with energy.

A method for producing an optoelectronic component is further specified. The optoelectronic component is preferably manufacturable by a method described herein. In other words, all features disclosed for the optoelectronic component are also disclosed for the method for producing an optoelectronic component, and vice versa.

According to at least one embodiment of the method for producing an optoelectronic component, the method comprises a method step in which at least two optoelectronic semiconductor chips are provided on a respective carrier, wherein the optoelectronic semiconductor chips are designed to emit electromagnetic radiation during operation. The optoelectronic semiconductor chips may each be attached to the carrier by bonding or soldering.

According to at least one embodiment of the method for producing an optoelectronic component, the method comprises a method step of providing at least one connecting element that is electrically conductive, flexible and extensible. The connecting element may be mechanically connected to two carriers. This means that the connecting element can be arranged between two carriers in each case. Thus, the carriers with the optoelectronic semiconductor chips and the at least one connecting element may be connected to each other as a chain.

According to at least one embodiment of the method for producing an optoelectronic component, the method comprises a method step in which the optoelectronic semiconductor chips and the connecting element are encompassed at least in some locations with a shaped body. The optoelectronic semiconductor chips and the connecting element can be encompassed by the shaped body by means of a casting and/or injection molding process. For this purpose, a molding compound may be brought into a predetermined mold and subsequently cured.

An optoelectronic component produced in this way can be flexible and extensible overall. Thus, the optoelectronic component can be used in a variety of applications. In particular, the optoelectronic component can be adapted to different and complicated geometries.

According to at least one embodiment of the method, at least one cavity is formed in the shaped body prior to encompassing the optoelectronic semiconductor chips and the connecting element with the shaped body. The connecting element may be arranged in the cavity. The cavity may be arranged such that the shaped body is spaced apart from the connecting element, at least in some locations. Further, the shaped body may be in direct contact with the optoelectronic semiconductor chips. Since the connecting element is arranged in the cavity, which is free from the shaped body, the connecting element can move freely. Because the connecting element can move freely in the cavity, the optoelectronic component is also flexible and extensible.

BRIEF DESCRIPTION OF THE DRAWINGS

In the following, the optoelectronic component described herein and the method for producing an optoelectronic component described herein will be explained in more detail in connection with exemplary embodiments and the accompanying figures.

Figure 2:
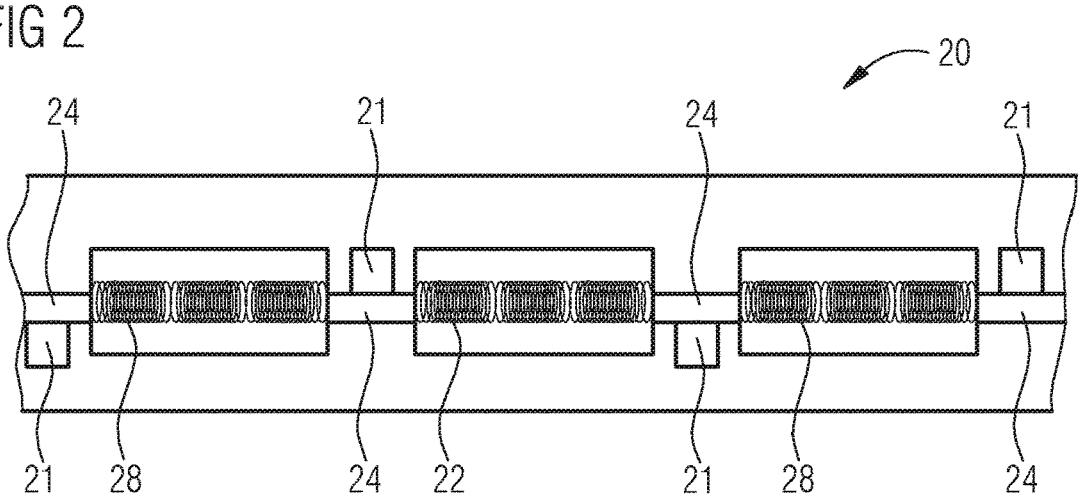
Figure 3:
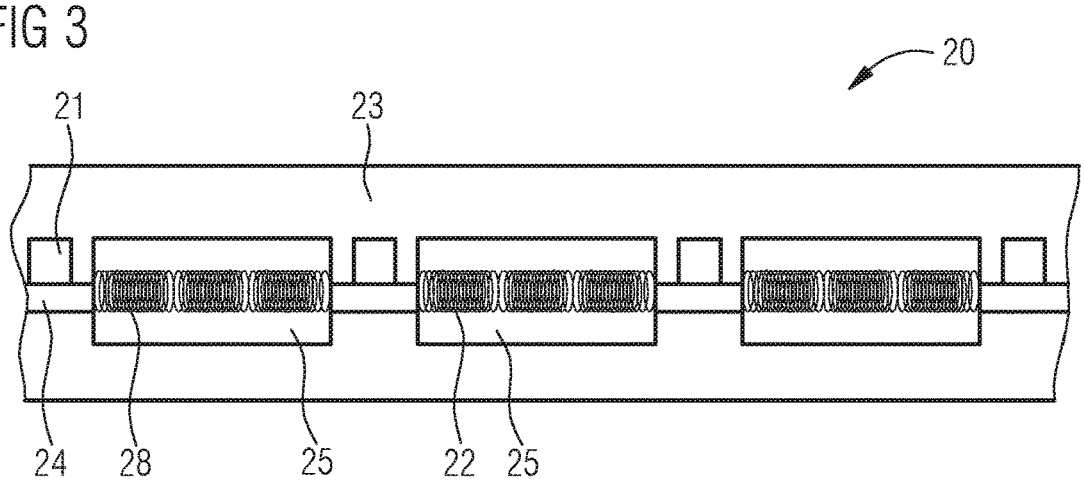
Figure 4:
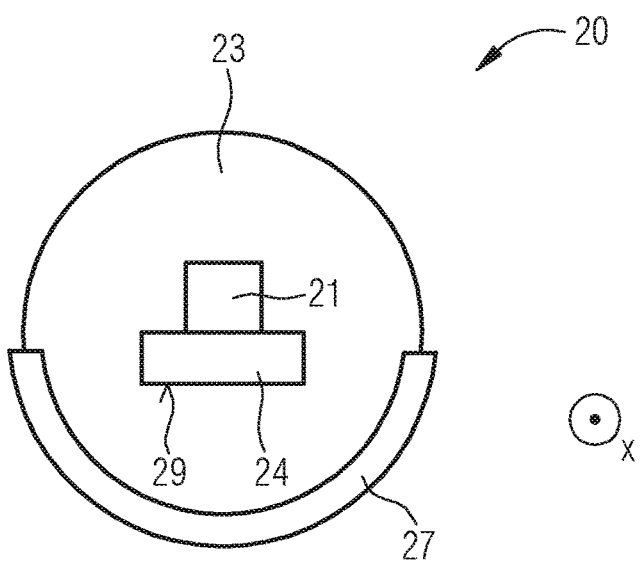

In the FIGS. 2, 3 and 4, schematic cross-sections through two further exemplary embodiments of the optoelectronic component are shown.

Figure 5:
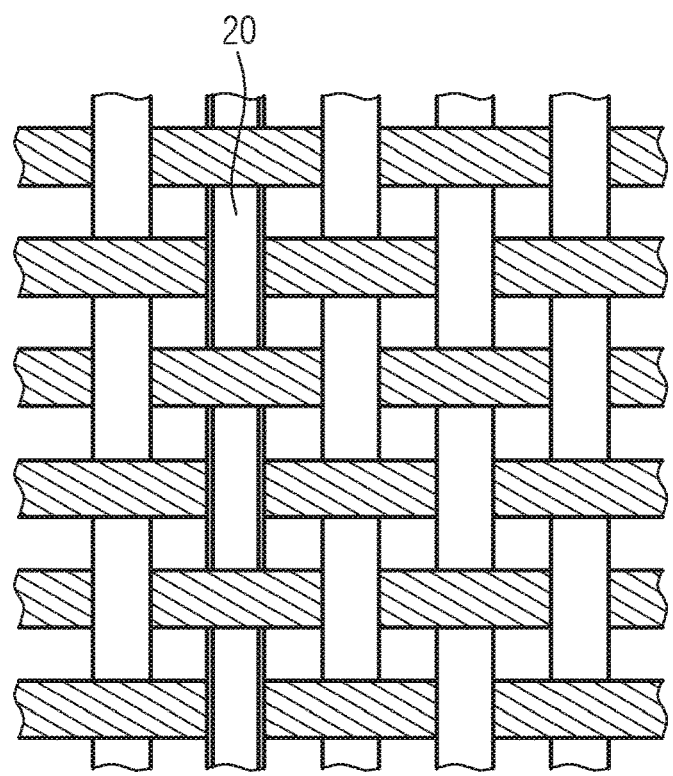
Figure 6A:
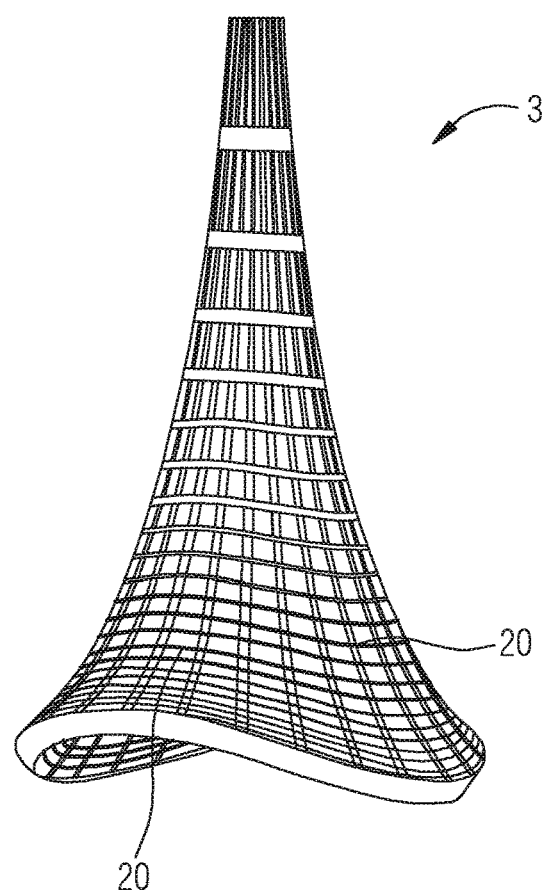
Figure 6B:
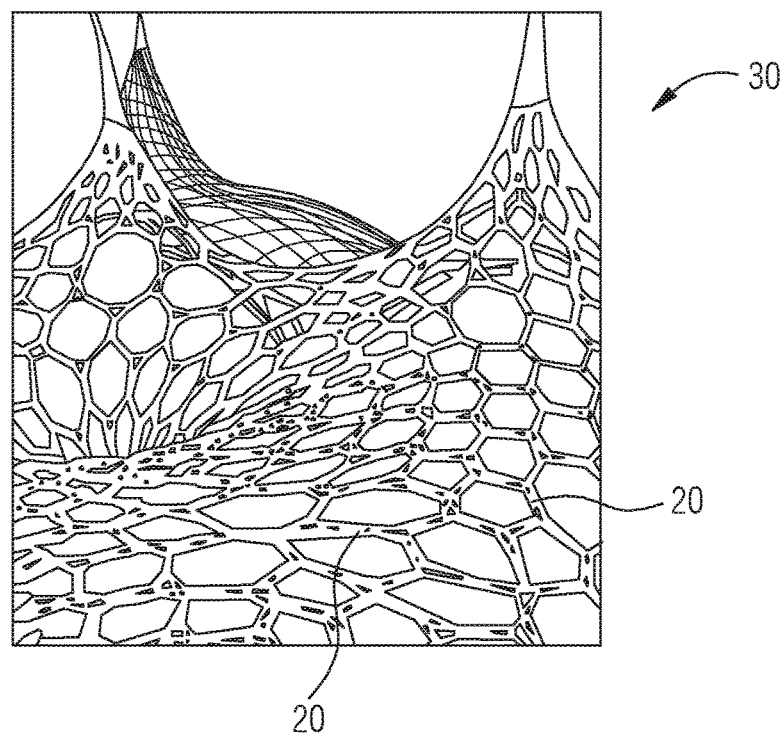

In the FIGS. 5, 6A and 6B, various applications of exemplary embodiments of the optoelectronic device are shown.

Figure 7A:
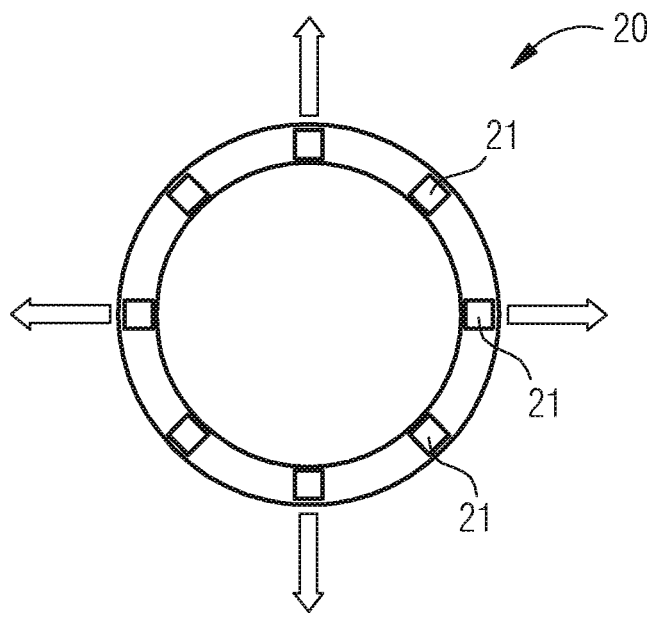
Figure 7B:
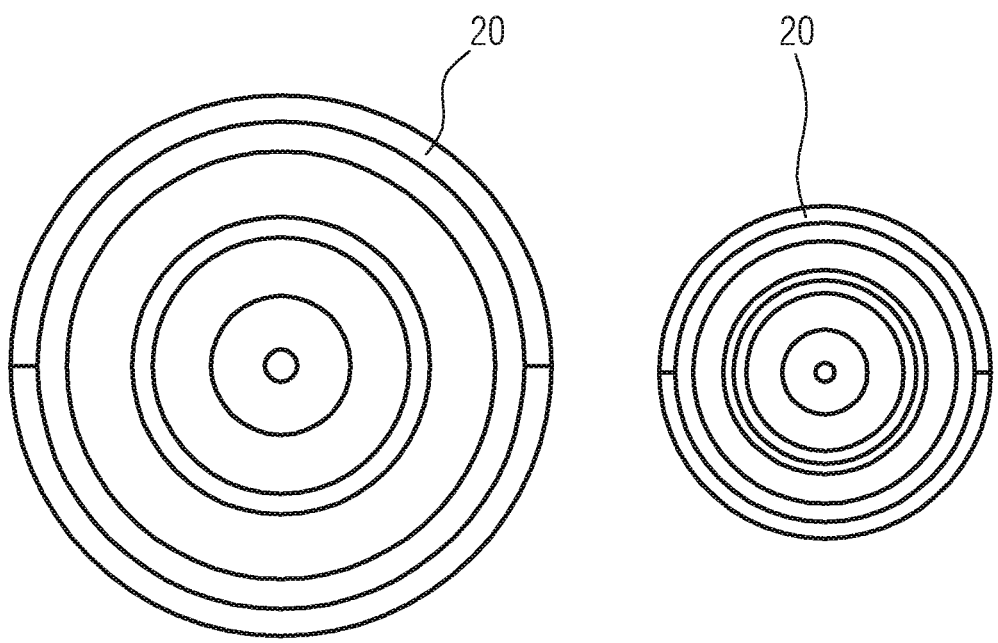

In the FIGS. 7A and 7B, another exemplary embodiment of the optoelectronic component is shown schematically.

Elements that are identical, similar or have the same effect are given the same reference signs in the figures. The figures and the proportions of the elements shown in the figures are not to be regarded as to scale. Rather, individual elements may be shown exaggeratedly large for better representability and/or for better comprehensibility.

DETAILED DESCRPITION

Figure 1:
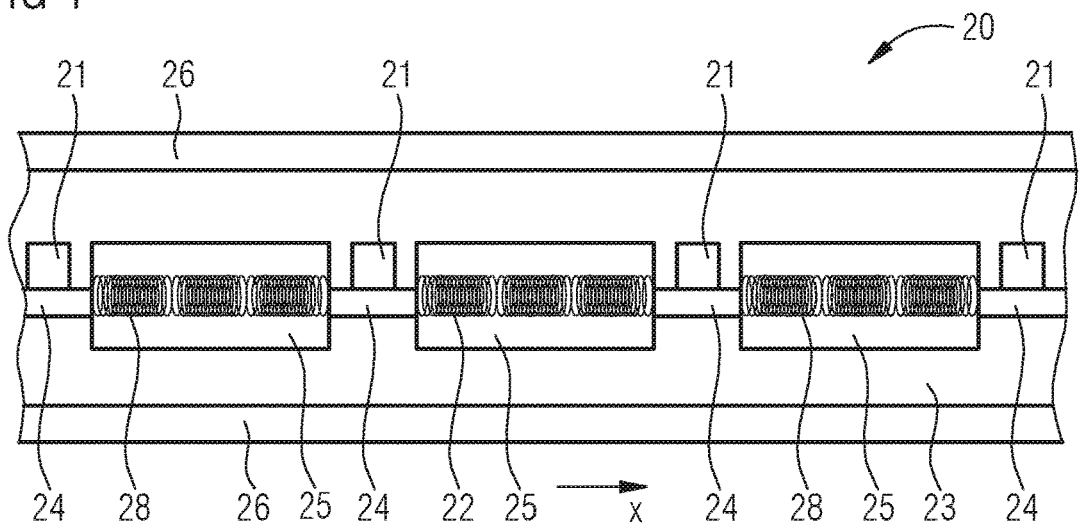
FIG. 1 shows a schematic cross-section through an optoelectronic component according to an exemplary embodiment.

In FIG. 1, a schematic cross-section through an optoelectronic component 20 according to an exemplary embodiment is shown. The schematic cross-section shows only a section of the optoelectronic component 20, which is represented by dashed lines at the edge. Thus, the structure of the optoelectronic component 20 shown may continue as desired subsequent to the dashed lines.

The optoelectronic component 20 comprises a plurality of optoelectronic semiconductor chips 21. The optoelectronic semiconductor chips 21 are designed to emit electromagnetic radiation during operation. The main radiation directions of the optoelectronic semiconductor chips 21 are the same or approximately the same. Each of the optoelectronic semiconductor chips 21 is arranged on a carrier 24. The carriers 24 are transparent to the electromagnetic radiation emitted from the respective optoelectronic semiconductor chip 21.

The optoelectronic component 20 further comprises at least one connecting element 22. In addition, the optoelectronic component 20 comprises two further connecting elements 28. The connecting elements 22, 28 are electrically conductive, flexible and extensible. Each of the connecting elements 22, 28 is formed in the shape of a spring or a coil and comprises a main extension direction x. Furthermore, the connecting elements 22, 28 are electrically connected to at least one carrier 24. In this exemplary embodiment, the connecting elements 22, 28 are electrically connected to the respective adjacent carriers 24. This preferably means that each connecting element 22, 28 is mechanically connected to two carriers 24. Thus, a connecting element 22, 28 is arranged between each two optoelectronic semiconductor chips 21. In addition, the optoelectronic semiconductor chips 21 are each arranged between a connecting element 22 and a further connecting element 28. Thus, a plurality of optoelectronic semiconductor chips 21 and a plurality of connecting elements 22, 28 are arranged in series or in the form of a chain overall.

The optoelectronic component 20 further comprises a shaped body 23. The shaped body 23 surrounds the optoelectronic semiconductor chips 21 and the at least one connecting element 22 at least in some locations. Furthermore, the shaped body 23 surrounds the further connecting elements 28 at least in some locations. The shaped body 23 comprises a molding compound comprising a polymeric material. Conversion particles and/or scatter particles may be brought into the molding compound. Cavities 25 are formed in the shaped body 23. The connecting elements 22, 28 are respectively arranged in the associated cavities 25. The cavities 25 are free of the molding compound. In a cross-section which runs perpendicular to the main extension direction x of the connecting elements 22, 28, a cavity 25 completely surrounds the respectively associated connecting element 22, 28.

The optoelectronic component 20 further comprises a sheating 26, the sheating 26 completely surrounding the shaped body 23.

The optoelectronic component 20 shown in FIG. 1 can be manufactured by providing the optoelectronic semiconductor chips 21 on the carriers 24. In addition, the connecting elements 22, 28 are provided and electrically and mechanically connected to the carriers 24. Subsequently, the optoelectronic semiconductor chips 21 and the connecting elements 22, 28 are encompassed at least in some locations with the shaped body 23 by means of a casting and/or injection molding process. For this purpose, the molding compound is brought into a predetermined mold and subsequently hardened. Before the optoelectronic semiconductor chips 21 and the connecting elements 22, 28 are encompassed with the shaped body 23, the cavities 25 are formed in the shaped body 23.

In FIG. 2, a schematic cross-section through a further exemplary embodiment of the optoelectronic component 20 is shown. In contrast to the exemplary embodiment shown in FIG. 1, the main radiation directions of the optoelectronic semiconductor chips 21 are different from each other. For this purpose, two of the carriers 24 with the optoelectronic semiconductor chips 21 are arranged rotated by 180° with respect to the other two carriers 24 with the optoelectronic semiconductor chips 21. This means that the main radiation directions of two adjacent optoelectronic semiconductor chips 21 are opposite to each other. In this way, the optoelectronic component 20 can emit electromagnetic radiation in different directions. The radiation emitted by the optoelectronic component 20 may be homogeneous.

Furthermore, compared to the exemplary embodiment shown in FIG. 1, the optoelectronic component 20 does not comprise a sheating 26. The sheating 26 is an optional additional protective layer.

In FIG. 3, a schematic cross-section through another exemplary embodiment of the optoelectronic component 20 is shown. Compared to the exemplary embodiment shown in FIG. 1, the optoelectronic component 20 does not comprise a sheating 26.

In FIG. 4, a schematic cross-section through another exemplary embodiment of the optoelectronic component 20 is shown. The cross-section is perpendicular to the main extension direction x of the connecting elements 22, 28. The plane of the cross-section passes through one of the optoelectronic semiconductor chips 21. The optoelectronic semiconductor chip 21 is arranged on the carrier 24. The shaped body 23 surrounds the optoelectronic semiconductor chip 21 and the carrier 24. The shaped body 23 comprises the shape of a circle in cross section. An extensible reflective layer 27 is provided on the shaped body 23 in some locations. The extensible reflective layer 27 is applied to a side of the shaped body 23 facing an underside 29 of the carrier 24, wherein the underside 29 faces away from the optoelectronic semiconductor chip 21. The extensible reflective layer 27 covers approximately half the circumference of the cross-section through the shaped body 23. Therefore, the shaped body 23 is free of the extensible reflective layer 27 in some locations. The shaped body 23 is free of the extensible reflective layer 27 on a side facing the optoelectronic semiconductor chip 21. The extensible reflective layer 27 is designed to reflect electromagnetic radiation emitted from the optoelectronic semiconductor chip 21. Thus, the optoelectronic device 20 emits electromagnetic radiation only on the side that is free of the extensible reflective layer 27.

In FIG. 5, the application of the optoelectronic component 20 according to an exemplary embodiment in a textile is shown. The optoelectronic component 20 is embedded in the textile by a weaving process. The textile may be a garment.

In FIG. 6A, another application of the optoelectronic component 20 according to an exemplary embodiment is shown. In this application, a plurality of optoelectronic components 20 are arranged in a light fixture 30. Since the optoelectronic components 20 are flexible and extensible, a complex geometry of the luminaire 30 can be achieved.

In FIG. 6B, another application of optoelectronic components 20 according to an exemplary embodiment in a luminaire 30 is shown. Also in this case, the flexibility and extensibility of the optoelectronic components 20 allow a complex geometry of the luminaire 30.

In FIG. 7A, a schematic cross-sectional view of another exemplary embodiment of the optoelectronic component 20 is shown. The structure of the optoelectronic component 20 is shown in simplified form and corresponds to the structure shown in FIG. 3. The optoelectronic component 20 comprises a total of eight optoelectronic semiconductor chips 21. Thus, a plurality of optoelectronic semiconductor chips 21 and a plurality of connecting elements 22, 28 are arranged along a ring. Since the optoelectronic component 20 is flexible and extensible, the diameter of the ring can be changed, which is shown by the four arrows.

In FIG. 7B, the embodiment of the optoelectronic component 20 shown in FIG. 7A is shown arranged on a camera. The camera is, for example, a camera from a smartphone. Two cameras with different diameters are shown. Since the optoelectronic component 20 is flexible and stretchable, it can be arranged on both cameras. Thus, the optoelectronic component 20 can be used as a flash light on a plurality of cameras of different sizes.

The invention is not limited to the embodiments by the description based thereon. Rather, the invention encompasses any new feature as well as any combination of features, which in particular includes any combination of features in the patent claims, even if this feature or combination itself is not explicitly stated in the patent claims or embodiments.

The invention claimed is:

1. An optoelectronic component comprising:
   at least two optoelectronic semiconductor chips designed to emit electromagnetic radiation in operation,
   at least one connecting element which is electrically conductive, flexible and extensible, and
   a shaped body surrounding the at least two optoelectronic semiconductor chips and the at least one connecting element at least in some locations, wherein
   the optoelectronic semiconductor chips are each arranged on a carrier,
   the shaped body is formed onto the optoelectronic semiconductor chips and/or the carrier, and
   at least one cavity is formed in the shaped body,
   the at least one connecting element is arranged in the cavity wherein the volume of the cavity is greater than the volume of the at least one connecting element and the cavity is filled with a gas, and
   the shaped body covers all surfaces of the optoelectronic semiconductor chips that are not covered by the carriers.

2. The optoelectronic component according to claim 1, in which the shaped body is formed using a casting and/or injection molding process.

3. The optoelectronic component according to claim 1, in which the carriers are each at least partially transparent to the electromagnetic radiation emitted by the respective associated optoelectronic semiconductor chip.

4. The optoelectronic component according to claim 1, in which the connecting element is in the form of a spring or a coil.

5. The optoelectronic component according to claim 1, in which the connecting element is electrically connected to at least one of the carriers.

6. The optoelectronic component according to claim 1, in which the shaped body comprises a molding compound.

7. The optoelectronic component according to claim 6, wherein the molding compound comprises a polymeric material.

8. The optoelectronic component according to claim 6, in which conversion particles and/or scattering particles are brought into the molding compound.

9. The optoelectronic component according to claim 1, in which an external sheathing surrounds the shaped body.

10. The optoelectronic component according to claim 1, in which the optoelectronic semiconductor chips are arranged in such a way that their main radiation directions are different from one another.

11. The optoelectronic component according to claim 1, in which an extensible reflective layer is applied to the shaped body in some locations.

12. The optoelectronic component according to claim 1, in which a connecting element is arranged between each two optoelectronic semiconductor chips.

13. The optoelectronic component according to claim 1, in which the optoelectronic semiconductor chips are arranged between a connecting element and a further connecting element.

14. The optoelectronic component according to claim 1, in which a plurality of optoelectronic semiconductor chips and a plurality of connecting elements are arranged in series.

15. The optoelectronic component according to claim 1, wherein a plurality of optoelectronic semiconductor chips and a plurality of connecting elements are arranged along a ring.

16. An optoelectronic device comprising:
the optoelectronic component according to claim 1, and
a power supply to which the optoelectronic component is electrically connected.

17. An optoelectronic component comprising:
at least two optoelectronic semiconductor chips designed to emit electromagnetic radiation in operation,
at least one connecting element which is electrically conductive, flexible and extensible, and
a shaped body surrounding the at least two optoelectronic semiconductor chips and the at least one connecting element at least in some locations, wherein
the optoelectronic semiconductor chips are each arranged on a carrier,
the shaped body is formed onto the optoelectronic semiconductor chips and/or the carrier, and
at least one cavity is formed in the shaped body, and
the at least one connecting element is arranged in the cavity, and
the shaped body comprises a molding compound wherein conversion particles and/or scattering particles are brought into the molding compound.

18. An optoelectronic component comprising:
at least two optoelectronic semiconductor chips designed to emit electromagnetic radiation in operation,
at least one connecting element which is electrically conductive, flexible and extensible, and
a shaped body surrounding the at least two optoelectronic semiconductor chips and the at least one connecting element at least in some locations, wherein
the optoelectronic semiconductor chips are each arranged on a carrier,
the shaped body is formed onto the optoelectronic semiconductor chips and/or the carrier, and
at least one cavity is formed in the shaped body, and
the at least one connecting element is arranged in the cavity, and
an extensible reflective layer is applied to the shaped body in some locations.

* * * * *